United States Patent
Baek

(10) Patent No.: US 8,644,082 B2
(45) Date of Patent: Feb. 4, 2014

(54) MEMORY APPARATUS AND METHOD FOR CONTROLLING ERASE OPERATION OF THE SAME

(75) Inventor: Kwang Ho Baek, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 180 days.

(21) Appl. No.: 13/219,623

(22) Filed: Aug. 27, 2011

(65) Prior Publication Data

US 2012/0218827 A1    Aug. 30, 2012

(30) Foreign Application Priority Data

Feb. 28, 2011    (KR) .................. 10-2011-0018215

(51) Int. Cl.
*G11C 11/34*    (2006.01)

(52) U.S. Cl.
USPC .............. 365/185.3; 365/185.29; 365/185.22; 365/185.13

(58) Field of Classification Search
USPC ............. 365/185.3, 185.29, 185.22, 185.13
See application file for complete search history.

(56) References Cited

U.S. PATENT DOCUMENTS

| | | | |
|---|---|---|---|
| 6,661,711 B2 | 12/2003 | Pan et al. | |
| 7,894,268 B2 * | 2/2011 | Hosono | 365/185.2 |
| 2003/0021155 A1 * | 1/2003 | Yachareni et al. | 365/185.22 |
| 2010/0172188 A1 * | 7/2010 | Chen et al. | 365/185.22 |
| 2011/0116322 A1 * | 5/2011 | Seol et al. | 365/185.25 |

FOREIGN PATENT DOCUMENTS

KR    1020100056749 A    5/2010

* cited by examiner

*Primary Examiner* — Vu Le
*Assistant Examiner* — Han Yang
(74) *Attorney, Agent, or Firm* — William Park & Associates Patent Ltd.

(57) ABSTRACT

An erase operation of a memory apparatus is controlled by, inter alia, selecting one or more memory cell blocks to be erased among a plurality of memory cell blocks, performing an erase operation on the selected one or more memory cell blocks in response to an erase command, performing a first soft program operation on the selected one or more memory cell blocks if the erase operation is determined as passed, and performing a second soft program operation on the selected one or more memory cell blocks if the first soft program operation is determined as passed.

25 Claims, 5 Drawing Sheets

MEMORY APPARATUS AND METHOD FOR CONTROLLING ERASE OPERATION OF THE SAME

CROSS-REFERENCES TO RELATED APPLICATION

The present application claims priority under 35 U.S.C. §119(a) to Korean application number 10-2011-0018215, filed on Feb. 28, 2011, in the Korean Intellectual Property Office, which is incorporated herein by reference in its entirety.

BACKGROUND

1. Technical Field

The present invention relates generally to a memory apparatus, and more particularly, to a semiconductor apparatus for improving the reliability of a nonvolatile memory apparatus and a method for fabricating the same.

2. Related Art

In general, a cell array in a nonvolatile memory apparatus includes a plurality of strings, and each string is made of memory cells connected in series with transistors formed at the string ends. The memory cells from different strings are electrically connected through word lines. Each string is electrically connected to a page buffer that senses data through a bit line.

A nonvolatile memory apparatus is electrically erasable and programmable. In an erase operation, a low gate voltage is applied to a control gate to extract electrons that were injected into a floating gate by the F-N tunneling effect,.

FIG. 1 illustrates a conventional erase operation in a nonvolatile memory apparatus.

Referring to FIG. 1, an erase operation is performed by floating a source select line and a drain select line, then applying a ground voltage (e.g., 0V) to a word line included in a block unit, and then applying a high voltage to a well formed in a semiconductor substrate. The threshold voltages of the cells to be erased through the above erase operation are distributed in an EV1 state as illustrated in FIG. 1.

However, some memory cells may be erased more excessively than other cells due to certain operating characteristics of the memory cells. The threshold voltages of the cells to be erased have to be distributed according to an erase voltage level EVL, but the threshold voltage distribution of the cells that were erased more excessively becomes lower than the erase voltage level EVL as illustrated in FIG. 1.

A Soft program On Chip (SOC) operation is performed to correct the threshold voltage distribution of the excessively-erased cells. The SOC operation repeats a program operation and a verify operation to correct a threshold voltage distribution of an EV1 state to a threshold voltage distribution of an EV2 state, that is, about the erase voltage level EVL.

The SOC operation can adjust the threshold voltage distribution of erased cells to about the erase voltage level EVL. However, the SOC operation fails to reduce the width of the threshold voltage distribution of the erased cells.

When the width of the threshold voltage distribution of erased cells is not sufficiently narrow, it will increase the program operation time. A wider width of the threshold voltage distribution of erased cells will also increase the threshold voltage distribution of programmed cells and cause an interference, thus degrading the reliability of the nonvolatile memory apparatus.

SUMMARY

Embodiments of the present invention provide a memory apparatus and a method for controlling an erase operation of the same, which can improve the reliability of the nonvolatile memory apparatus by improving the threshold voltage distribution of an erase cell.

In an embodiment of the present invention, a memory apparatus comprising: a memory cell array comprising a plurality of memory cells connected to a common source line and word line; a control logic unit configured to select one or more of the memory cells and perform one or more of an erase operation in response to an erase operation command, a first soft program operation, and a second soft program operation if the first soft program operation is passed; and a voltage generating unit configured to apply a first voltage to a word line of the one or more memory cells selected in the first soft program operation and apply a second voltage having a different level from the first voltage to the word line in the second soft program operation.

A method for controlling an erase operation of a memory apparatus according to an embodiment of the present invention comprising the steps of: selecting one or more memory cell blocks to be erased among a plurality of memory cell blocks; performing an erase operation on the selected one or more memory cell blocks in response to an erase command; performing a first soft program operation on the selected one or more memory cell blocks if the erase operation is determined as passed; and performing a second soft program operation on the selected one or more memory cell blocks if the first soft program operation is determined as passed.

Further, a method for controlling an erase operation of a memory apparatus according to an embodiment of the present invention comprising the steps of: selecting one or more of memory cell blocks in response to an erase command; applying a first-level voltage to a word line of the selected one or more memory cell block to perform an erase operation; applying a second-level voltage to the word line to perform a first soft program operation if the erase operation is passed; and applying a third-level voltage to the word line to perform a second soft program operation if the first soft program operation is passed.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus and a method for controlling an erase operation of the same according to the present invention will be described below with reference to the accompanying drawings through exemplary embodiments.

Figure 1:
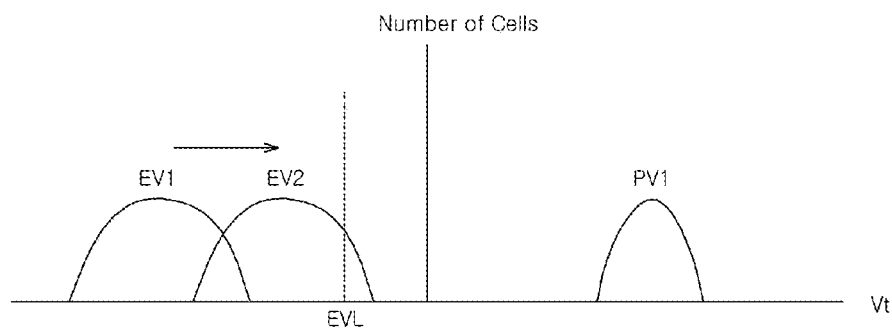
FIG. 1 is a diagram illustrating an erase operation of a conventional nonvolatile memory apparatus.
Figure 2:
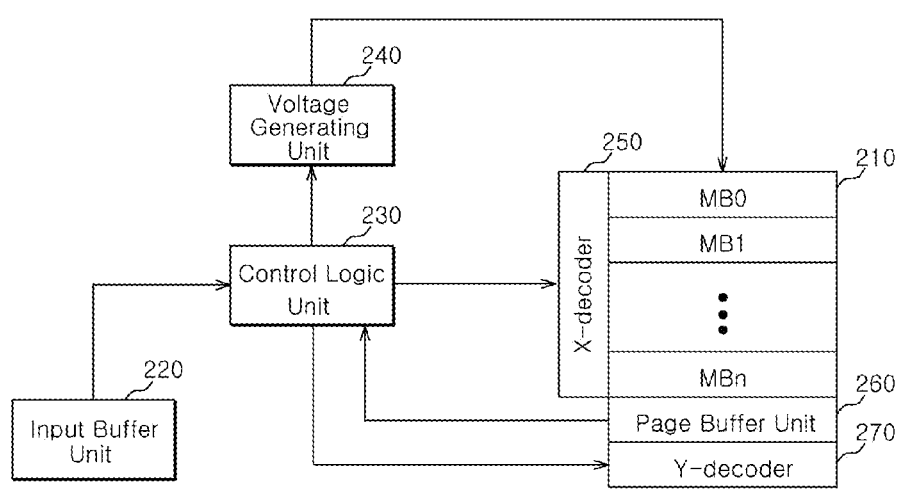
FIG. 2 is a block diagram of a nonvolatile memory apparatus according to an exemplary embodiment of the present invention.
Figure 3:
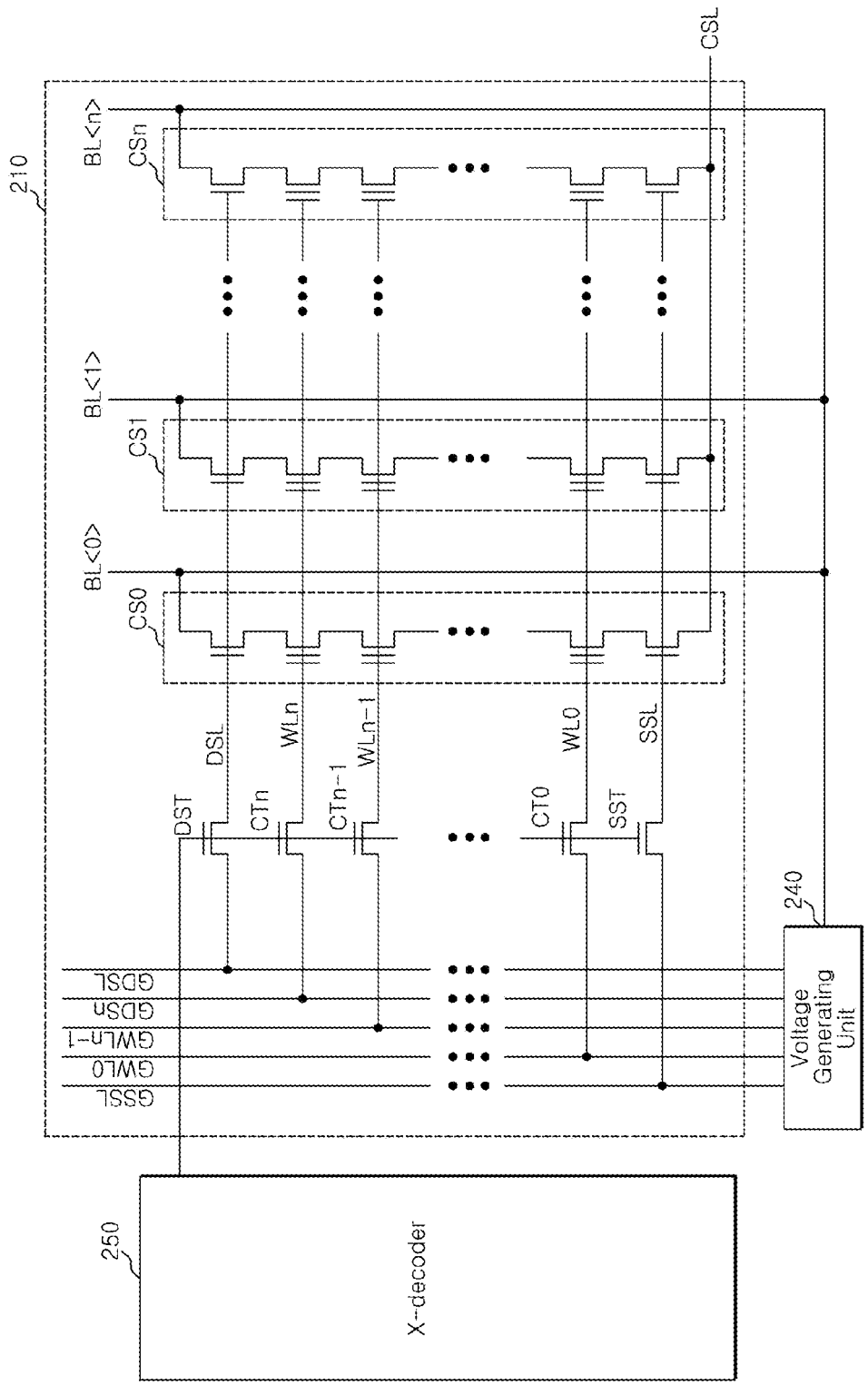
FIG. 3 is a diagram illustrating a portion of a nonvolatile memory apparatus according to an exemplary embodiment of the present invention.

FIG. 2 is a block diagram of a nonvolatile memory apparatus according to an exemplary embodiment of the present invention. FIG. 3 is a diagram illustrating a portion of a nonvolatile memory apparatus according to an exemplary embodiment of the present invention.

Referring to FIGS. 2 and 3, a nonvolatile memory apparatus 200 according to an exemplary embodiment of the present invention may include a memory cell array 210, an input buffer unit 220, a control logic unit 230, a voltage generating unit 240, an X-decoder 250, a page buffer 260, and a Y-decoder 270.

The memory cell array 210 includes a plurality of memory cell blocks MB0, MB1, . . . , MBn, each including a plurality of cells. Also, although not shown in FIG. 2, the memory cell array 210 includes a plurality of cell strings CS0, CS1, . . . , CSn disposed between a common source line CSL and a plurality of bit lines BL0, BL1, . . . , BLn. Each of the cell strings CS0, CS1, . . . , CSn includes a drain select transistor DST, a plurality of cell transistors CT0, . . . , CTn-1, CTn, and a source select transistor SST, which are connected in series. Herein, a gate of the drain select transistor DST is connected to a drain select line DSL, gates of the cell transistors CT0, . . . , CTn-1, CTn are connected respectively to local word lines WL0, . . . , WLn-1, WLn, and a gate of the source select transistor SST is connected to a source select line SSL. Also, the bit lines BL0, BL1, . . . , BLn are connected respectively to page buffers PB0, PB1, . . . , PBn.

The input buffer unit 220 receives a command signal or an address signal from an external device and outputs the command signal to the control logic unit 230.

The control logic unit 230 receives a command signal from the input buffer unit 220 and generates an erase command, a first soft program operation command, and a second soft program operation command. Also, the control logic unit 230 receives data outputted from the page buffer unit 260 and the Y-decoder 270, and controls operations of the voltage generating unit 240 and the X-decoder 250 according to the received data.

Also, the control logic unit 230 sets a second erase voltage level in a second soft program operation. The second erase voltage level is set according to a voltage level applied to the word lines WL0, . . . , WLn-1, WLn. That is, if the voltage level applied to the word lines WL0, . . . , WLn-1, WLn is high, the second erase voltage level is set to be high, and if the voltage level applied to the word lines WL0, . . . , WLn-1, WLn is low, the second erase voltage level is set to be low.

The second erase voltage level is set to be located in a lower region than a predetermined first erase voltage level. The first erase voltage level is a voltage level set in a first soft program operation. The first erase voltage level is set to be between the threshold voltage distribution in an erase operation and the threshold voltage distribution in a first program operation.

The voltage generating unit 240 generates a voltage in response to a command generated by the control logic unit 230. When receiving an erase command from the control logic unit 230, the voltage generating unit 240 generates a bulk voltage Vb and provides the same to the wells of memory cells. The bulk voltage Vb may have a high level. Also, a positive voltage having a first level higher than 0V is applied to the global word lines GWL0, . . . , GWLn-1, GWLn. The first-level voltage is inputted to perform a first soft program operation. Thereafter, if the threshold voltage distribution does not approach the first erase voltage level, the level of the bulk voltage Vb is increased to again perform the first soft program operation.

If the width of the threshold voltage distribution is not sufficiently narrow even after completion of the first soft program operation, a second soft program operation is performed to reduce the width of the threshold voltage distribution. In this case, the voltage generating unit 240 applies a positive voltage having a second level lower than the first level to the global word lines GWL0, . . . , GWLn-1, GWLn. The reason for this is that the erase voltage level is set according to the voltage level applied to the global word lines GWL0, . . . , GWLn-1, GWLn.

The X-decoder 250 receives an address signal from the control logic unit 230, and decodes the address signal to generate a decoding signal. The X-decoder 250 selects one or more of the blocks of the memory cell array 210 according to the decoding signal, and connects the local word lines WL0, . . . , WLn-1, WLn and the global word lines GWL0, . . . , GWLn-1, GWLn of the selected block. An erase operation is performed on the selected blocks.

The page buffer unit 260 stores the second voltage level set according to the threshold voltage distribution of the memory block on which the erase operation and the first soft program operation have been performed. The page buffer unit 260 stores the cells, are located in a lower region than the second erase voltage level in the threshold voltage distribution, as '0' and stores the cells, which are located in a higher region than the second erase voltage level, as '1'.

The Y-decoder 270 receives data outputted from the memory cell array 210 after the erase operation, the first soft program operation and the second soft program operation, and outputs the data to the control logic unit 230.

The erase operation of the nonvolatile memory apparatus 200 according to an exemplary embodiment of the present invention will be described below in more detail with reference to FIGS. 4A to 4D.

FIGS. 4A to 4D are diagrams illustrating a first soft program operation and a second soft program operation of the nonvolatile memory apparatus 200 according to an exemplary embodiment of the present invention. FIG. 5 is a diagram illustrating a voltage variation of the nonvolatile memory apparatus 200 according to an exemplary embodiment of the present invention.

Figure 4A:
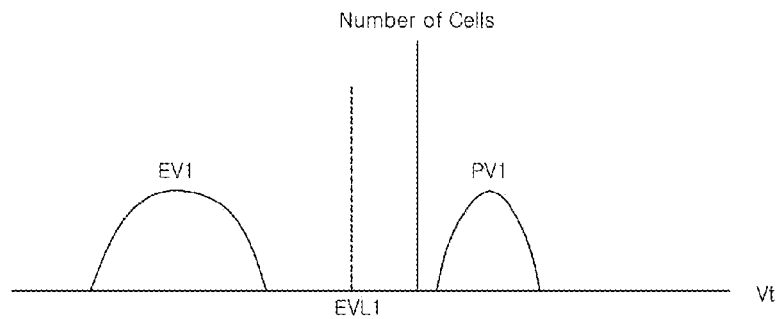
FIGS. 4A to 4D are diagrams illustrating a first soft program operation and a second soft program operation of a nonvolatile memory apparatus according to an exemplary embodiment of the present invention.
Figure 5:
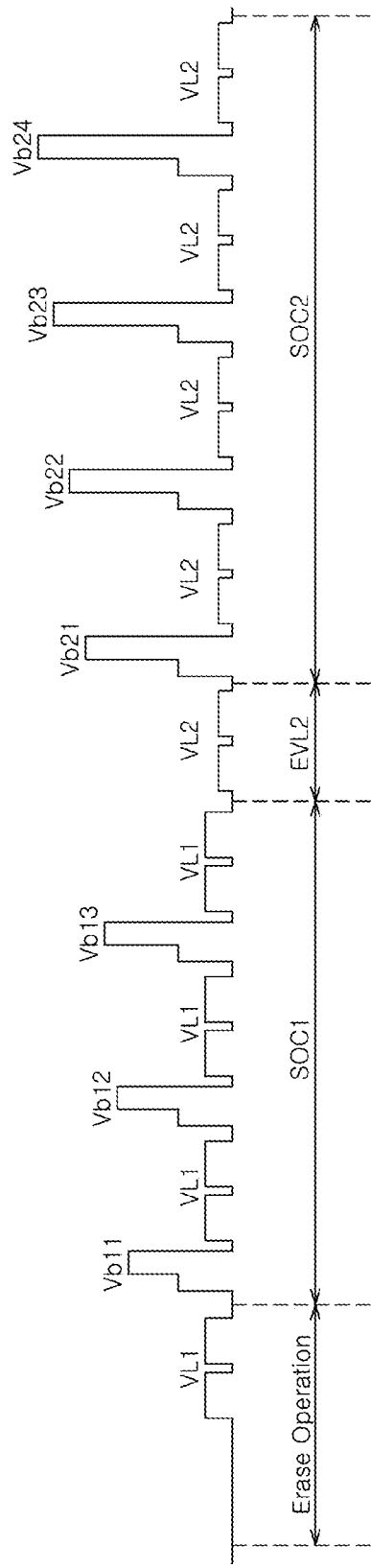
FIG. 5 is a diagram illustrating a voltage variation of a nonvolatile memory apparatus according to an exemplary embodiment of the present invention.

Referring to FIGS. 2 and 4A, in the nonvolatile memory apparatus 200 according to an exemplary embodiment of the present invention, the control logic unit 230 generates an erase command and controls operations of the voltage generating unit 240 and the X-decoder 250. That is, the control logic unit 230 controls the X-decoder 250 to select one or more cell blocks to be erased among the memory cell array. The voltage generating unit 240 generates a bulk voltage Vb applied to a well of the selected cell and a voltage level applied to the global word line GWL. The voltage level applied to the global word line GWL has a first level VL1 higher than 0V, as illustrated in FIG. 5.

As illustrated in FIG. 4A, the threshold voltages (Vt) of the cells erased through an erase verification operation are distributed in an EV1 state. In general, the threshold voltage distribution (EV1) of the erase state (EV1) means a state lower than 0V.

An erase verification operation is performed to verify the erase operation. The erase verification operation is performed to verify whether the threshold voltage distribution EV1 is located in a region lower than 0V.

Figure 4B:
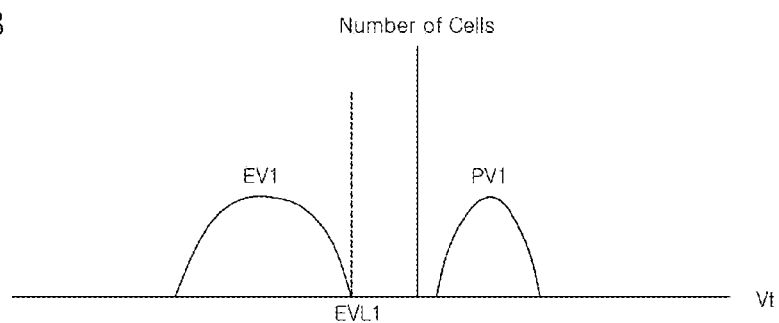

As illustrated in FIG. 4B, a first soft program operation SOC1 is performed to correct a threshold voltage distribution EV1 to a first erase voltage level EVL1. As illustrated in FIG. 5, the voltage applied in the first soft program operation SOC1 is equal to the voltage level applied to the global word line GWL in the erase operation. However, the scope according to an embodiment of the present invention is not limited thereto, and the voltage level VL1 applied to the global word line GWL in the first soft program operation SOC1 may be lower than or higher than the voltage level applied in the erase operation.

In the verification operation of the first soft program operation SOC1, a voltage with a first level is applied to the global word line GWL, and a bulk voltage Vb with a high level is applied to a well of the cell. As a result, when the threshold voltage distribution EV1 of the erased cells is shifted to approach the first erase voltage level EVL1, the threshold voltage distribution EV1 of the erased cells is distributed to approach the first erase voltage level EVL1 as illustrated in FIG. 4B. If the threshold voltage distribution EV1 is distributed to approach the first erase voltage level EVL1, the first soft program operation SOC1 is passed. On the other hand, if the threshold voltage distribution EV1 is not distributed to approach the first erase voltage level EVL1, the first soft program operation SOC1 is failed. In case of a failure, as illustrated in FIG. 5, the bulk voltage Vb having a level Vb12 higher than the previous high level Vb11 of the bulk voltage Vb is applied to again perform the first soft program operation SOC1.

Figure 4C:
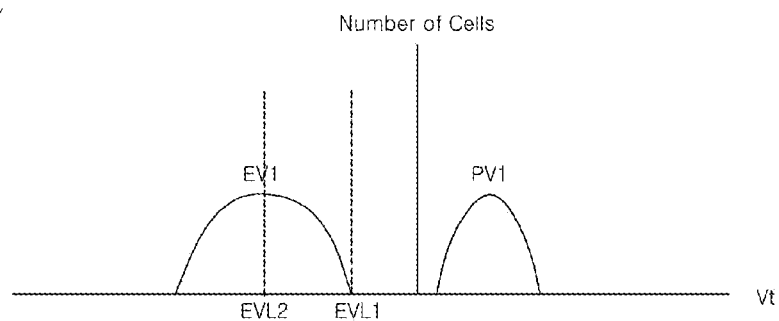

When the first soft program operation SOC1 is passed by repetition of this process, a second soft program operation SOC2 is performed to reduce the width of the threshold voltage distribution EV1 of the erased cells. In the second soft program operation SOC2, a voltage with a second level VL2 is applied to the global word line GWL. As illustrated in FIGS. 4C and 5, the second level VL2 is set to be lower than the first level VL1. A second voltage level EVL2 is set according to the second level VL2. A value of the cells located in a region lower than the second erase voltage level EVL2 is set to '0', and a value of the cells located in a region higher than the second erase voltage level EVL2 is set to '1' prior to storage in the page buffer unit 260.

Figure 4D:
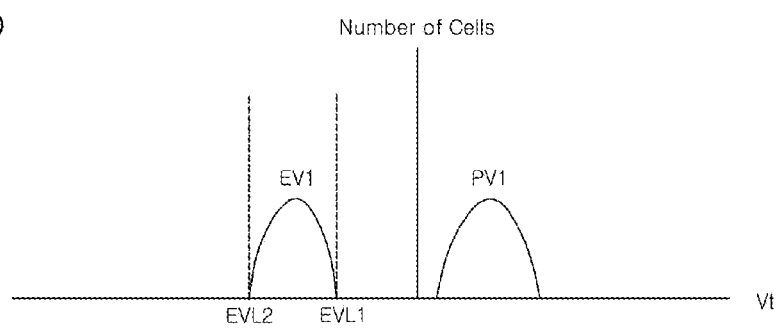

Referring back to FIG. 2, the values stored in the page buffer unit 260 are inputted into the control logic unit 230, and the second soft program operation SOC2 is performed on the basis of the inputted values. In the second soft program operation SOC2, the cells stored as '1' are not shifted, and the cells stored as '0' are shifted. If the threshold voltage distribution EV1 does not approach the second erase voltage level EVL2 after completion of the second soft program operation SOC2, the bulk voltage Vb having a level Vb22 higher than the previous high level Vb21 of the bulk voltage Vb is applied to again perform the second soft program operation SOC2. When the second soft program operation SOC2 is passed by repetition of this process, the width of the threshold voltage distribution of the erased cells is reduced as illustrated in FIG. 4D, thus making it possible to reduce the interference and improve the reliability of the nonvolatile memory apparatus.

The erase operation of the nonvolatile memory apparatus 200 according to an exemplary embodiment of the present invention will be described below in more detail with reference to FIG. 6.

Figure 6:
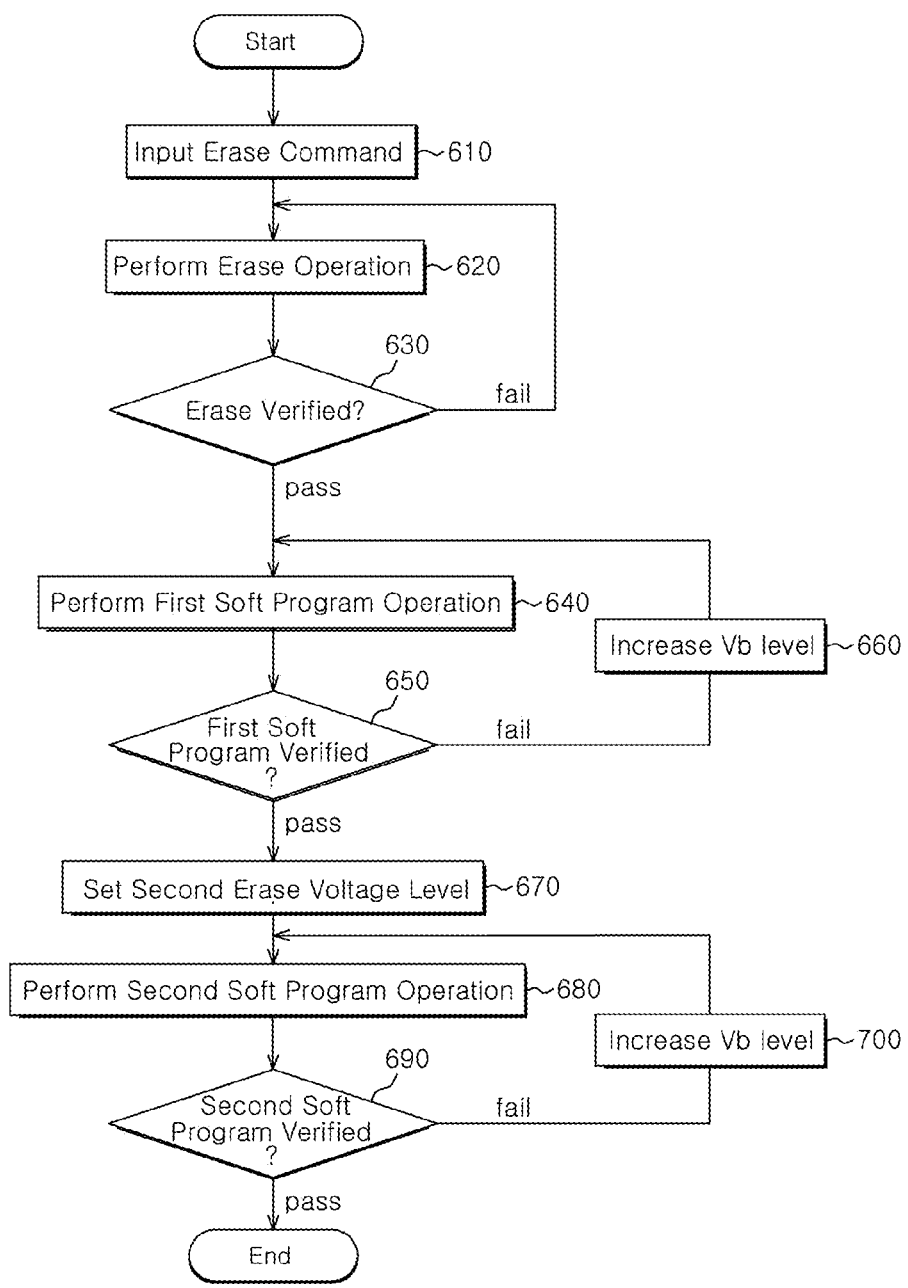
FIG. 6 is a flow diagram illustrating a method for controlling an erase operation of a nonvolatile memory apparatus according to an exemplary embodiment of the present invention.

FIG. 6 is a flow diagram illustrating a method for controlling an erase operation of the nonvolatile memory apparatus 200 according to an exemplary embodiment of the present invention.

Referring to FIG. 6, when an erase command is inputted into the nonvolatile memory apparatus 200 at step 610, the X-decoder 250 selects one or more of a plurality of memory cell blocks.

Thereafter, a voltage having a level higher than 0V is applied to the word line WL of the selected memory cell block, and a bulk voltage Vb is applied to a well to perform an erase operation at step 620.

Thereafter, at step 630, it is determined whether the erase verification operation has passed or failed. The erase verification operation may be verified based on whether the threshold voltage (Vt) distribution EV1 of the erased cells is located in a negative region. If any cell of the selected memory block is not erased, the threshold voltage of the cell would not have a negative value (i.e., a value lower than 0V). In this manner, if the threshold voltage value is not negative, the erase operation is determined to be failed. On the other hand, if all the cells of the selected memory cell block have a is negative voltage level (i.e., a voltage level lower than 0V), the erase operation is determined to have passed.

When the erase verification operation is passed by repetition of this process, a first soft program operation SOC1 is performed (640). The first soft program operation SOC1 is performed to shift the right edge and the left edge of the threshold voltage distribution EV1 so that the threshold voltage distribution EV1 of the erased cells approaches the first erase voltage level EVL1.

Thereafter, a first soft program verification operation is performed to verify the first soft program operation SOC1 at step 650. The first soft program verification operation is performed to determine whether the threshold voltage distribution EV1 approaches the first erase voltage level EVL1. Accordingly, if the threshold voltage distribution EV1 of the erased cells approaches the first erase voltage level EVL1, it is determined to have passed the first soft program verification operation. On the other hand, if the threshold voltage distribution EV1 of the erased cells does not approach the first erase voltage level EVL1, the first soft profram verification operation is determined to be failed at step 650. In this case, as illustrated in FIG. 5, the level of a bulk voltage Vb applied to the well of the selected memory cell block is increased (660) to again perform the first soft program operation SOC1 (640).

When at step 650 the first soft program operation SOC1 is determined to have passed, a second erase voltage level EVL2 is set to be lower than the first erase voltage level EVL1 at step 670. The is second erase voltage level EVL2 is set to be lower than the first erase voltage level EVL1, such that the second erase voltage level EVL2 is set to have a higher level than the cell having the lowest voltage level in the threshold voltage distribution EV1. The second erase voltage level EVL2 may be set by applying a voltage level lower than the first erase voltage level EVL1 to the word line WL of the erased cells. The second erase voltage level EVL2 may be stored in the page buffer unit 260. The page buffer unit 260 may store as '0's for the cells, which are distributed at positions lower than the second erase voltage level EVL2, and stores as '1's for the cells, which are distributed at positions higher than the second erase voltage level EVL2.

Thereafter, a second soft program operation SOC2 is performed at step 680. In the second soft program operation SOC2, the cells stored as '1's are not corrected, but the cells stored as '0's are corrected to reduce the width of the threshold voltage distribution EV1. That is, only the cells stored as '0's are shifted to the right to reduce the width of the threshold voltage distribution EV1, so that it is distributed as illustrated in FIG. 4D. Accordingly, the interference in the program operation of the nonvolatile memory apparatus 200 can be reduced, thus making it possible to improve the reliability of the nonvolatile memory apparatus.

A verification operation is performed to determine whether the second soft program operation SOC2 has passed or failed at step 690. The second soft program verification operation is performed to determine whether the threshold voltage distribution EV1 approaches the second erase voltage level EVL2. Accordingly, if the threshold voltage distribution EV1 of the erased cells approaches the second erase voltage level EVL2, it is determined to have passed. On the other hand, if the threshold voltage distribution EV1 of the erased cells does not approach the second erase voltage level EVL2, it is determined to have failed. In this case when the second soft program operation is determined to have failed, as illustrated in FIG. 5, the level of the bulk voltage applied to the well of the selected memory cell is increased at step 700 to again perform the second soft program operation SOC2 at step 680.

When the second soft program operation SOC2 is determined to have passed at step 680, the erase operation is completed.

As described above, the nonvolatile memory apparatus and the erase operation control method thereof according to an embodiment of the present invention perform, inter alia, the first soft program operation to shift the threshold voltage distribution to the first erase voltage level, and shift the threshold voltage distribution to the second erase voltage level to reduce the width of the threshold voltage distribution, thereby making it possible to reduce the interference of the programmed cells and improve the reliability of the nonvolatile memory apparatus.

While certain embodiments have been described above, it will be understood to those skilled in the art that the embodiments described are by way of example only. Accordingly, the apparatus and method described herein should not be limited based on the described embodiments. Rather, the apparatus and method described herein should only be limited in light of the claims that follow when taken in conjunction with the above description and accompanying drawings.

What is claimed is:

1. A memory apparatus comprising:
a memory cell array comprising a plurality of memory cells connected to a common source line and a word line;
a control logic unit configured to perform an erase operation on one or more memory cells, a first soft program operation, and a second soft program operation if the first soft program operation is passed and to set a first erase voltage level for the first soft program operation to perform a first soft program verify operation and a second erase voltage level for the second soft program operation to perform a second soft program verify operation; and
a voltage generating unit configured to apply a first voltage to a word line of the one or more memory cells selected in the first soft program operation and apply a second voltage having a different level from the first voltage to the word line in the second soft program operation.

2. The memory apparatus according to claim 1, wherein the second erase voltage level is set to be located in a more negative region than the first erase voltage level.

3. The memory apparatus according to claim 2, wherein the second erase voltage level is set to be a level between the first erase voltage level and a voltage level of the cell having the lowest value in the threshold voltage distribution of the erased cells.

4. The memory apparatus according to claim 1, wherein in the second soft program operation, the control logic unit sets the cells, which are located in a more negative region than the second erase voltage level in the threshold voltage distribution of one or more memory cells erased, to '0' and sets the cells, which are located in a more positive region than the second erase voltage level, to '1'.

5. The memory apparatus according to claim 3, further comprising a page buffer configured to store values of the cells set based on the second erase voltage level.

6. The memory apparatus according to claim 1, wherein the voltage generating unit generates the second voltage having a level lower than the first voltage.

7. The memory apparatus according to claim 1, wherein if the first soft program operation is determined to be failed, the voltage generating unit generates a first soft program voltage having a higher level than in the previous first soft program operation.

8. The memory apparatus according to claim 1, wherein if the second soft program operation is determined to be failed, the voltage generating unit generates a second soft program voltage having a higher level than in the previous second soft program operation.

9. A method for controlling an erase operation of a nonvolatile memory apparatus, comprising the steps of:
selecting one or more memory cell blocks to be erased among a plurality of memory cell blocks;
applying a first-level voltage to a word line in the selected one or more memory cell blocks during an erase operation;
performing a first soft program operation on the selected one or more memory cell blocks if the erase operation is determined as passed, wherein the step of performing the first soft program operation comprises the step of applying the first-level voltage to the word line and applying a first-level bulk voltage to a well of the selected one or more memory cell block; and
performing a second soft program operation on the selected one or more memory cell blocks if the first soft program operation is determined as passed,
wherein the first-level voltage of the first soft program operation is equal or higher than the first-level voltage of the erase operation.

10. The method according to claim 9, wherein the step of performing the first soft program operation comprises:
determining whether the threshold voltage distribution of erased cells approaches a first erase voltage level; and
determining that the first soft program operation is failed, if the threshold voltage distribution of erased cells does not approach the first erase voltage level,
wherein the first-level voltage is provided to the word line and a bulk voltage having a higher level than the first level is provided so as to repeat performing the first soft program operation.

11. The method according to claim 10, wherein the first erase voltage level is set to be between the threshold voltage distribution in the erase operation and the threshold voltage distribution in a first program operation.

12. The method according to claim 9, wherein the step of performing the second soft program operation comprises the step of applying a second-level voltage to a word line of the selected memory cell block and applying a second-level bulk voltage to a well of the selected one or more memory cell block.

13. The method according to claim 12, wherein the second-level voltage applied to the word line is lower than the first-level voltage set in the first soft program operation.

14. The method according to claim 12, wherein the step of performing the second soft program operation further comprises:
setting a second erase voltage level; and
storing the cells, which are located in a lower region than the second erase voltage level, as '0' and storing the cells, which are located in a higher region than the second erase voltage level, as '1'.

15. The method according to claim 14, wherein the second erase voltage level is located in a more negative region than the first erase voltage level set in the first soft program operation.

16. The method according to claim 14, wherein the step of performing the second soft program operation reduces the width of the threshold voltage distribution by shifting only the cells stored as '0'.

17. A method for controlling an erase operation of a nonvolatile memory apparatus, comprising the steps of:
selecting one or more of memory cell blocks in response to an erase command;
applying a first-level voltage to a word line of the selected one or more memory cell blocks to perform an erase operation;
applying a second-level voltage which is equal to or higher than the first-level voltage to the word line to perform a first soft program operation if the erase operation is passed; and
applying a third-level voltage to the word line to perform a second soft program operation if the first soft program operation is passed.

18. The method according to claim 17, wherein the third-level voltage has a level lower than the first level.

19. The method according to claim 17, wherein the step of performing the first soft program operation sets a first erase voltage level to be between the threshold voltage distribution in the erase operation and the threshold voltage distribution in a first program operation.

20. The method according to claim 19, wherein the step of performing the first soft program operation comprises:
determining that the first soft program operation is passed, if the threshold voltage distribution of the cells of the erased memory cell blocks approaches the first erase voltage level; and
determining that the first soft program operation is failed, if the threshold voltage distribution of the cells of the erased memory cell blocks does not approach the first erase voltage level.

21. The method according to claim 20, wherein, if the first soft program operation is determined to be failed, a voltage having a higher level than the voltage applied in the first soft program operation is applied to a well of the erased memory cell to again perform the first soft program operation.

22. The method according to claim 17, wherein the step of performing the second soft program operation sets a second erase voltage level to be within the threshold voltage distribution in the erase operation.

23. The method according to claim 22, wherein the second erase voltage level is located in a more negative region than the first erase voltage level set in the first soft program operation.

24. The method according to claim 22, wherein the step of performing the second soft program operation comprises:
determining that the second soft program operation is passed, if the threshold voltage distribution of the cells of the erased memory cell blocks is located between the first erase voltage level and the second erase voltage level; and
determining that the first soft program operation is failed, if the threshold voltage distribution of the cells of the erased memory cell blocks is not located between the first erase voltage level and the second erase voltage level.

25. The method according to claim 24, wherein if the second soft program operation is determined to be failed, a voltage having a higher level than the voltage applied in the second soft program operation is applied to a well of the erased memory cell to again perform the second soft program operation.

* * * * *